United States Patent
Simmons et al.

(10) Patent No.: US 8,808,588 B1
(45) Date of Patent: Aug. 19, 2014

(54) METHODS FOR INTEGRATING A FUNCTIONAL COMPONENT INTO A MICROFLUIDIC DEVICE

(75) Inventors: Blake Simmons, San Francisco, CA (US); Linda Domeier, Danville, CA (US); Noble Woo, El Monte, CA (US); Timothy Shepodd, Livermore, CA (US); Ronald F. Renzi, Tracy, CA (US)

(73) Assignee: Sandia Corporation, Albuquerque, NM (US)

( * ) Notice: Subject to any disclaimer, the term of this patent is extended or adjusted under 35 U.S.C. 154(b) by 1202 days.

(21) Appl. No.: 12/012,653

(22) Filed: Feb. 4, 2008

Related U.S. Application Data

(62) Division of application No. 10/754,286, filed on Jan. 8, 2004, now Pat. No. 7,351,380.

(51) Int. Cl.
    *G01N 15/06* (2006.01)
    *G01N 33/00* (2006.01)

(52) U.S. Cl.
    USPC ............ 264/33; 422/50; 422/68.1; 422/502; 422/503

(58) Field of Classification Search
    USPC ................... 422/50, 68.1, 502, 503
    See application file for complete search history.

(56) References Cited

U.S. PATENT DOCUMENTS

| | | | |
|---|---|---|---|
| 4,792,396 A | 12/1988 | Gundelfinger | |
| 5,744,100 A | 4/1998 | Krstanovic | |
| 5,890,745 A | 4/1999 | Kovacs | |
| 6,123,798 A | 9/2000 | Gandhi et al. | |
| 6,209,928 B1 | 4/2001 | Benett et al. | |
| 6,273,478 B1 | 8/2001 | Benett et al. | |
| 6,290,791 B1 | 9/2001 | Shaw et al. | |
| 6,319,476 B1 | 11/2001 | Victor et al. | |
| 6,428,053 B1 | 8/2002 | Tai et al. | |
| 6,447,661 B1 | 9/2002 | Chow et al. | |
| 6,623,860 B2 * | 9/2003 | Hu et al. | 428/411.1 |
| 6,787,339 B1 * | 9/2004 | Rhine et al. | 435/173.7 |
| 6,921,603 B2 * | 7/2005 | Morse et al. | 429/442 |
| 7,186,352 B2 * | 3/2007 | Morse et al. | 216/67 |
| 7,419,822 B2 * | 9/2008 | Jeon et al. | 435/288.5 |
| 2002/0025576 A1 | 2/2002 | Northrup et al. | |
| 2002/0074271 A1 * | 6/2002 | Hu et al. | 210/101 |
| 2002/0093143 A1 | 7/2002 | Tai et al. | |
| 2002/0117517 A1 | 8/2002 | Unger et al. | |
| 2002/0125139 A1 | 9/2002 | Chow et al. | |
| 2002/0134907 A1 * | 9/2002 | Benett et al. | 249/135 |
| 2003/0026740 A1 | 2/2003 | Staats | |
| 2003/0138941 A1 * | 7/2003 | Gong et al. | 435/287.2 |
| 2003/0203271 A1 | 10/2003 | Morse et al. | |
| 2004/0018611 A1 * | 1/2004 | Ward et al. | 435/287.2 |
| 2004/0106192 A1 * | 6/2004 | Jeon et al. | 435/305.2 |
| 2004/0238484 A1 * | 12/2004 | Le Pioufle et al. | 216/27 |
| 2005/0067286 A1 | 3/2005 | Ahn et al. | |

* cited by examiner

*Primary Examiner* — Brian J Sines
(74) *Attorney, Agent, or Firm* — Dorsey & Whitney LLP

(57) ABSTRACT

Injection molding is used to form microfluidic devices with integrated functional components. One or more functional components are placed in a mold cavity, which is then closed. Molten thermoplastic resin is injected into the mold and then cooled, thereby forming a solid substrate including the functional component(s). The solid substrate including the functional component(s) is then bonded to a second substrate, which may include microchannels or other features.

16 Claims, 3 Drawing Sheets

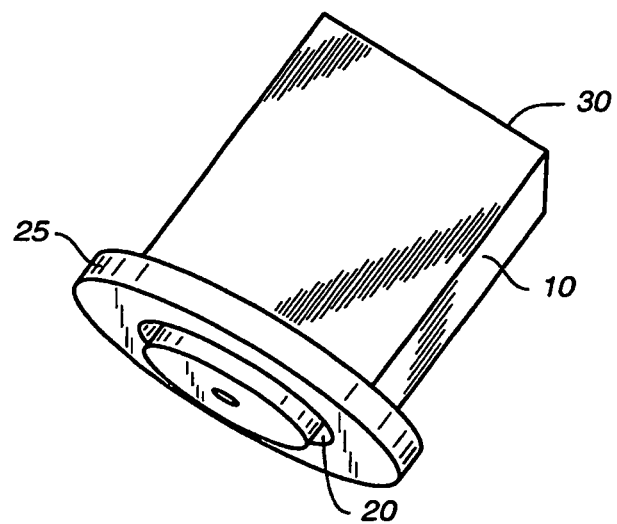
FIG._1A
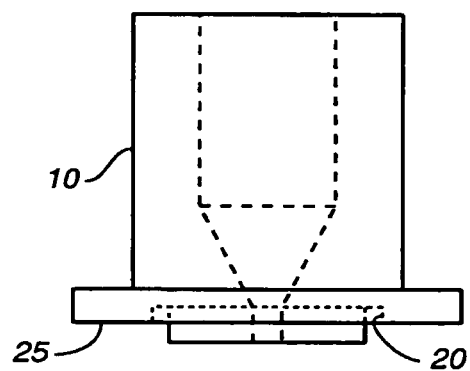
FIG._1B

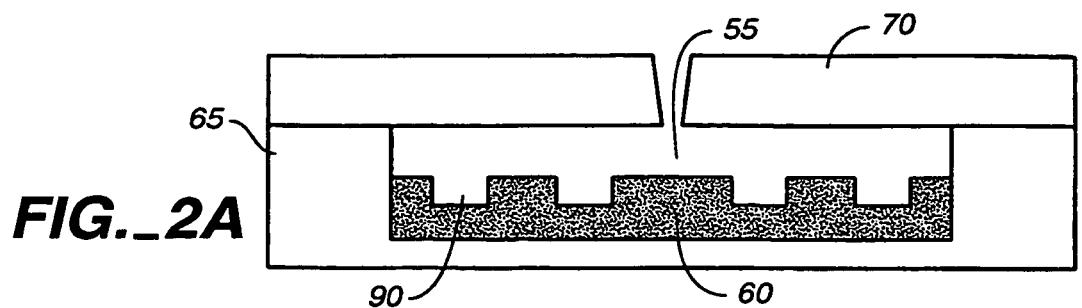
FIG._2A
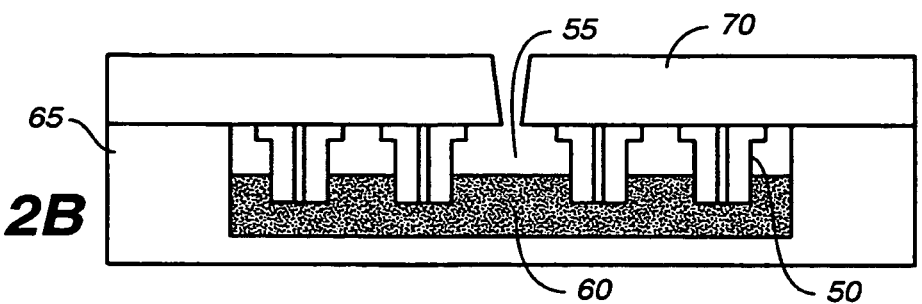
FIG._2B
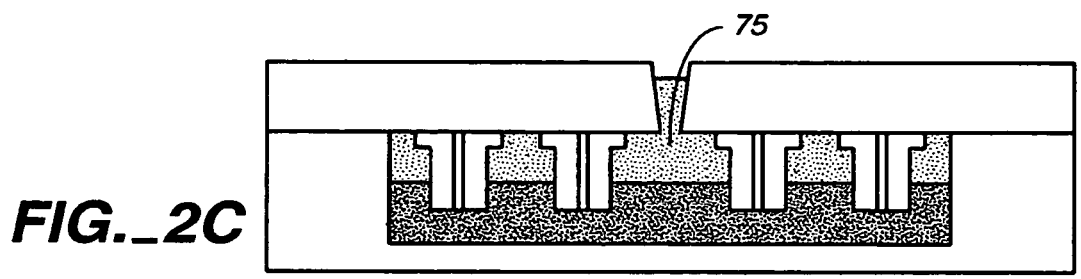
FIG._2C
FIG._2D
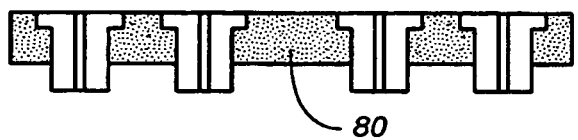
FIG._2E
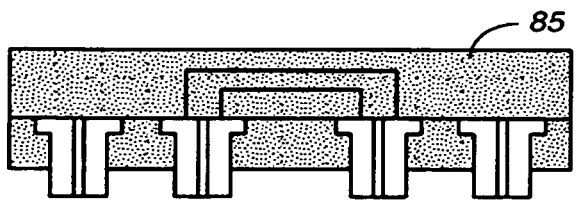

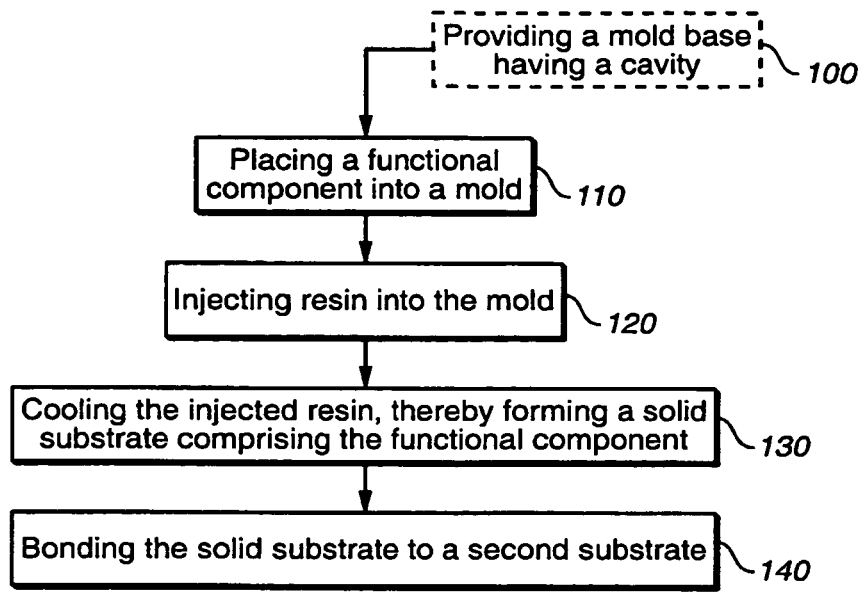
FIG._3
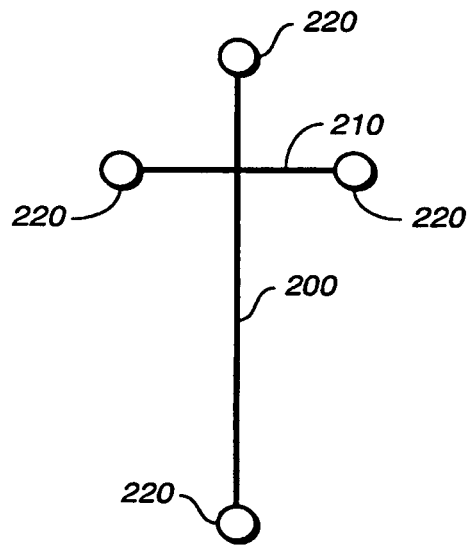
FIG._4

METHODS FOR INTEGRATING A FUNCTIONAL COMPONENT INTO A MICROFLUIDIC DEVICE

CROSS-REFERENCE TO RELATED APPLICATIONS

This application is a divisional application of prior U.S. patent application Ser. No. 10/754,286 originally filed Jan. 8, 2004 entitled, "Microfluidic Structures and Methods for integrating a Functional Component into a Microfluidic Device," and issued as U.S. Pat. No. 7,351,380 on Apr. 1, 2008. This application and patent are incorporated by reference in their entirety and for any purpose.

STATEMENT OF GOVERNMENT INTEREST

This invention was made with Government support under government contract no. DE-AC04-94AL85000 awarded by the U.S. Department of Energy to Sandia Corporation. The Government has certain rights in the invention, including a paid-up license and the right, in limited circumstances, to require the owner of any patent issuing in this invention to license others on reasonable terms.

TECHNICAL FIELD

The present invention relates to microfluidic devices, and more particularly, to integrating functional components into microfluidic devices.

BACKGROUND OF THE INVENTION

Microfluidic devices are increasingly used to manipulate and handle small fluid volumes for reactive, analytical, sensing and other applications. Although microfluidic devices contain features on the microscale-such as channels and chambers-the devices frequently must interact with other external devices or assemblies. For example, microfluidic devices may require connection to a larger fluid source or integration with a sensor, pumping or other external assembly.

One approach to this integration involves securing discrete, functional components, such as flow connectors, to a microfluidic device using an adhesive. However, adhering each component in this manner may limit the pressure that can be applied before leakage occurs between the component and the device substrate. Alignment errors may also be introduced as each component is independently adhered to the device substrate. Further, this technique limits the components that may be attached to the device to those that are chemically compatible with the adhesive used to attach them.

There is therefore a need to improve the technology used to form connections between a microfluidic device and an external component, as well as to increase the range of functional components that can be connected to a microfluidic device.

There is also a desire to provide a method for rapidly forming microfluidic replicates in a manner that incorporates the needed functional components during the replication process.

SUMMARY OF THE INVENTION

In accordance with a first aspect of the invention, a method for integrating a functional component to a microfluidic device is provided. A functional component is placed into a predetermined location in a mold cavity. Resin is injected into the mold cavity and cooled, thereby forming a solid substrate containing the functional component, which is bonded to a second substrate to form the functional microfluidic device. The second substrate, in some embodiments, contains at least one microfluidic channel.

In accordance with a second aspect of the invention, a microfluidic device is provided: A functional component is embedded in a solid substrate in a predetermined location. A second substrate is bonded to the solid substrate such that the functional component imparts electrical, optical, mechanical, or other functionality to the device.

BRIEF DESCRIPTION OF THE DRAWINGS

FIG. 1A is an isometric view depicting a flow connector for integration with a microfluidic device according to an example of the invention.

FIG. 1B is a cross-sectional view of the flow connector according to an example of the invention.

FIGS. 2A-2E are cross-sectional views depicting one embodiment of a microfluidic device according to the present invention at various stages as the device is being made.

FIG. 3 is a flow chart of a method of forming a microfluidic device having an integrated functional component, according to an example of the invention.

FIG. 4 is a schematic of a microfluidic device according to an example of the invention.

DETAILED DESCRIPTION OF PREFERRED EMBODIMENTS

Embodiments of the present invention provide methods for integrating a functional component into a microfluidic device. A functional component, as used herein, refers generally to any component of interest that may be advantageously integrated with a second substrate to form a functional device, as described further below. In some embodiments, the functional component provides electrical, mechanical, optical, or other functionality to a microfluidic device. Accordingly, functional components include flow connectors, circuits or other electronic chips or devices, optical waveguides, fiber optic cables, lenses, RF transmitters or receivers, flow detectors, flow regulators, other sensors or transducers, laser diodes, light emitting diodes, pressure transducers, optical filters optical elements, reservoirs, electrodes, salt-bridges, membranes, flow valves, high voltage power supplies, and the like. Such functional components may be fabricated from a wide range of polymeric, metal or ceramic materials. Substantially any component suitable to withstand the injection molding process described below may be used as a functional component as described herein.

Functional components useful in embodiments of the present invention include, for example, polymer fittings and flow connectors described further in U.S. patent application Ser. No. 10/405,842, filed 2 Apr. 2003, entitled "Micromanifold Assembly", and U.S. patent application Ser. No. 10/405,204, filed 2 Apr. 2003 entitled "High Pressure Capillary Connector," all of which are hereby incorporated by reference in their entirety.

FIG. 1A depicts a flow connector 10 that may be integrated into a microfluidic device in accordance with an embodiment of the present invention. FIG. 1B depicts a cross-sectional view of the flow connector 10. As shown in FIGS. 1A and 1B, the flow connector 10 includes a flange 25 and an annular groove 20 that advantageously increase the coupling between the connector 10 and an injected resin. The flow connector 10 further has a square body portion 30 to reduce any rotation of the connector 10 within a solid substrate (not shown in FIGS. 1A, 1B) after the molding process is complete. Although a flow connector 10 is illustrated in the exemplary FIGS. 1A and 1B, other functional components may be used in other embodiments and may include a groove or other structure to strengthen the coupling between the component and the resin and may also include a square or other profile to reduce rotation. The flow connector shown in FIGS. 1A and 1B is approximately 0.2" in height and 0.2" in width. Different dimensions, however, may be used in other embodiments.

FIG. 2A shows an empty mold cavity 55. As shown in FIG. 2B, functional components labeled 50 are placed into the mold cavity 55. Although four functional components 50 are shown in FIG. 2A, it is to be understood that any number of functional components may be used including 1, 2, 3, 4, 5, 6, 7, 8, 9, and 10 functional components. More functional-components are used in other embodiments. Further, a combination of different functional components 50 may be placed into the mold cavity in some embodiments. The mold cavity 55 is defined by a mold base suitable for injection molding, as is known in the art. Such mold bases typically are made from tool steel and comprise a top 70 and bottom 65, which are mounted on facing platens of an injection molding machine. Upon closure of the platens, the mold cavity 55 is formed by the bottom 65 and top 70 of the mold base.

Injection molding machines may be vertically-clamping or horizontally-clamping, as is known in the art, and either may be used. Vertically-clamping machines are advantageous in embodiments of the present invention. In some embodiments, horizontally-clamping machines require use of other fixtures to prevent the functional components from falling out of the mold. In some embodiments, the mold base defining the cavity 55 has more than two pieces (the top 65 and the top 70, as shown in FIG. 2). Generally, any equipment suitable for injection molding may be used.

The mold cavity 55 may be of substantially any size or shape suitable for the molding process, and may include tooling to introduce molded features such as microfluidic channels or chambers. The mold cavity may also include depressions 90 or protrusions, which can be used to position and fixture the functional components 50 that are placed within the mold cavity prior to resin injection as shown in FIGS. 2A and 2B. The depressions or protrusions are positioned to hold the functional components 50 in place in a predetermined location, such that when bonded with a second substrate 85, functionality is added to the resultant device. Depending on the functional components 50 used, the functionality added may be electrical, optical, mechanical, or other functionality. Such cavity features may be contained in either the top 70 or the bottom 65 of the mold base. Upon sealing of the mold cavity 55, the inserted functional components 50 are sealed or pressed against the opposing surfaces of the mold cavity 55. This provides fixturing of the components and also seals any channels within components such as fluidic connectors from being filled by injected resin. For example, in the embodiment shown in FIG. 2B, flow connectors shown in FIGS. 1A and 1B are present in the sealed mold 55 cavity. The lip of the flow connectors is pressed against the top 70 while the other end of the connectors is pressed into a depression 90 in another surface of the cavity 55 thus limiting or preventing resin from filling a channel within the flow connector. In some embodiments, a compliant shim or gasket (not shown) may be placed between the functional component 50 and the mold cavity 55 to prevent damage to the flow connector and/or to enhance the seal between the functional component and the mold.

While the mold cavity depressions 90 and protrusions described above may be machined directly into the mold base 65 forming the mold cavity 55, in some embodiments, a cavity tool 60 which provide the required depressions, protrusions or other features which allow positioning and fixturing of the added functional components is placed in the mold cavity 55. Such cavity tools may also contain microfluidic features such as channels and chambers. In some embodiments, the cavity tool 60 is removable. In some embodiments, the cavity tool 60 is removable, such that the mold base may be used without the cavity tool 60, or another cavity tool placed in the mold base. The cavity tool 60 may generally be made of any material suitable to withstand the injection molding process including for example metals such as steel.

Injection molding proceeds, as is known in the art and shown in FIG. 2C, by injecting resin 75 into the mold cavity 55. Any resin suitable for injection molding may be used. Typical thermoplastic resins include acrylics, polyolefins, polycarbonates, polyesters and many others. In some embodiments, thermosets are used. Of interest in many microfluidic applications are optically transparent resins including cyclic-olefin copolymers such as ethylene-norbornene copolymers and dicyclopentadiene copolymers and others. The particular resin chosen will depend on the application, the materials of the functional components used, and the material of the second substrate 85 to which the substrate containing the functional components will be bonded. In some embodiments, the functional components used are formed from one or more polymeric materials having a glass transition or melting point temperature higher than the glass transition temperature of the polymer resin used to form the substrate in the injection molding process. However, in other embodiments the functional component may not have a glass transition temperature higher than that of the resin and the difference in thermal properties between a functional component and the resin may be advantageously used to increase the strength of the interaction between the resin and the component. In some embodiments, the functional component is made from or coated with the same resin used in the injection molding process. Accordingly, as is known in the art, during injection molding, molten resin is injected into a mold, and as it cools, forms a solid substrate.

In a preferred embodiment, a commercially available vertical injection molding machine was used such as the TH60-VSE from Nissei America, Inc. Anaheim, Calif. A custom mold base was designed and fabricated, which allowed cavity tool inserts to be placed in either side of the mold base 65. The use of cavity tool inserts also allows adjustments in the depth of the cavity 55.

As shown in FIGS. 2C and 2D, the resin 75 in the mold cavity 55 forms a solid substrate 80 including the functional components 50. The solid substrate 80 is then removed from the mold cavity 55. As shown in FIG. 2E, the solid substrate 80 including the functional components 50 is bonded to a second substrate 85. The bonding occurs through any of a variety of methods known in the art, including fusion bonding, adhesives, and the like.

The second substrate 85 may be made of any of a variety of materials according to embodiments of the present invention, including, for example, polymers such as thermoplastics or elastomers, metals such as steel, titanium, gold, aluminum, semiconductors such as silicon or GaAs, and insulators such as glass, quartz, silicon dioxide, and the like. The particular substrate 85 selected will depend on the application, the features in the substrate 85, the resin used in the injection molding process, and the functional components contemplated. The second substrate 85 to which the injection molded substrates are bonded may have a variety of features, in accordance with embodiments of the invention, including, for example one or more mixers, pumps, valves, heaters, coolers, channels, chambers, fluid ports, and the like.

By way of summary, a method of forming an integrated microfluidic device according to an embodiment of the present invention is shown in FIG. 3. A mold base defining at least one cavity is provided (see step 100). An interchangeable cavity tool may be placed in a mold base, or the mold cavity tooling may be an integral part of the mold base, in accordance with embodiments of the present invention. At least one functional component is placed in the mold cavity and/or into a depression defined by the mold base (step 110). Resin is injected into the mold cavity (step 120). The resin is cooled, thereby forming a solid substrate including the functional component (step 130), which can be removed from the mold cavity. The solid substrate including the functional component is then bonded to a second substrate (step 140). In some embodiments, further components may be connected to the bonded device. For example, in one embodiment the flow connector 10 is incorporated into an injection molded solid substrate, and bonded to a second substrate having a microchannel, such that access to the microchannel is provided through the flow connector 10. Accordingly, tubing and an external pump may be attached to one or more of the flow connectors, in accordance with an embodiment of the invention. For example, in a preferred embodiment the flow connector is attached to a silica capillary tube by a compression fitting that is attached by screws (not shown) to the flow connector.

A top-down view of a device according to an embodiment of the present invention is shown schematically in FIG. 4. A microchannel 200 is provided in a microfluidic substrate having an inlet and outlet. A second microchannel 210 is also provided in the microfluidic substrate, with a second inlet and outlet. A cavity tool is machined to hold flow connectors in positions complementary to the inlets and outlets of the microchannels 200 and 210. The flow connectors incorporated into an injection molded substrate, as described above, and bonded to the substrate containing the microchannels 200 and 210 such that the flow connectors 220 are aligned with the microchannel inlets and outlets. Accordingly, as shown in FIG. 4, fluid enters and exits either the microchannel 200 or the microchannel 210 through the flow connectors 220. In a similar manner, other types of functional components may be aligned to features, such as electrodes, optically transparent regions, thermally conductive regions, and the like, of a second substrate.

After the injection molded substrate has been formed, it is bonded with a second substrate. In some embodiments, the bond forms a watertight seal and will allow for the successful operation of a microfluidic device. The bonding process typically involves an alignment step, in some embodiments of the two substrates one with the flow connectors the other containing the channel, to allow access to the microfluidic features. In some embodiments, no alignment is necessary. After properly aligned, if necessary, the two substrates are bonded together to produce a functioning microfluidic device. The bonding process may include hot die bonding, thermal diffusion bonding, solvent bonding, infrared welding, ultraviolet irradiation, ultrasonic welding, or other joining technologies known in the art, or combinations thereof. In some embodiments, an adhesive, seal, or gasket, is placed between the two substrates.

Embodiments of devices according to the present invention are able to operate at increased pressures relative to those having functional components adhesively bonded with epoxies or other adhesive materials to the surface. For example, in the embodiment shown schematically in FIG. 4, fluid can be pumped through the channel 210 or the channel 200 at a pressure typically in the range of 100-970 psi. In other embodiments, a lower pressure is used. A similar device utilizing a flow connector adhesively bonded to the surface withstood only a pressure of about 680 psi.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for integrating a functional component to a microfluidic device, the method comprising:
    embedding the functional component in a solid substrate, including:
        placing the functional component into a mold cavity;
        injecting resin into the mold cavity; and
        cooling the injected resin, thereby forming a solid substrate containing the functional component; and
    bonding the solid substrate comprising the functional component to a second substrate, wherein said bonding the solid substrate includes aligning an opening of the functional component to a fluid port of a fluid channel in the second substrate.

2. A method according to claim 1, wherein the act of placing comprises placing the functional component into a predetermined position in the mold cavity.

3. A method according to claim 1, wherein the second substrate forms at least a portion of a microfluidic device.

4. A method according to claim 1, further comprising placing a plurality of functional components into the mold, and wherein the solid substrate formed contains the plurality of functional components.

5. A method according to claim 1 wherein the act of placing the functional component into a mold cavity comprises:
    providing a mold base defining a cavity having a predetermined shape to hold the functional components in a predetermined location; and placing the functional component into the cavity.

6. A method according to claim 5 wherein the cavity dimensions and the mold base comprises a mold insert.

7. A method according to claim 1 wherein the second substrate comprises a plurality of fluid channels.

8. A method according to claim 1 wherein the second substrate comprises a substrate chosen from the group of substrates consisting of glass, polymer, silicon, thermosets, thermoplastic, and combinations thereof.

9. A method according to claim 1, wherein the functional component is selected from the group of functional components consisting of a flow connector, a circuit, an optical waveguide, an electrical interconnect, a fiber optic cable, a lens, a radio-frequency transmitter, a flow detector, a flow regulator, a laser diode, a light emitting diode, a pressure transducer, an optical filter or optical element, a reservoir, an electrode, a salt-bridge, a membrane, a flow valve, a high voltage power supply and combinations thereof.

10. A method according to claim 1, wherein the functional component comprises a flow connector.

11. A method according to claim 1, wherein the complementary feature comprises an electrical interconnect.

12. A method according to claim 1 wherein the act of bonding the solid substrate to the second substrate comprises using a joining process selected from the group of joining processes consisting of hot die bonding, thermal diffusion bonding, solvent bonding, infrared welding, ultraviolet irradiation, ultrasonic welding, and combinations thereof.

13. A method according to claim 1 wherein the act of bonding the solid substrate to the second substrate comprises applying an adhesive between at least a portion of the solid substrate and the second substrate.

14. A method according to claim 1 wherein the act of bonding the solid substrate to the second substrate comprises placing a seal between the solid substrate and the second substrate.

15. A method according to claim 1, wherein said functional component is formed prior to injecting the resin into the mold cavity.

16. A method according to claim 1, wherein said injecting the resin into the mold cavity comprises surrounding the functional component in the mold cavity with the injected resin.

* * * * *